US011945691B2

(12) United States Patent
Robibero et al.

(10) Patent No.: US 11,945,691 B2
(45) Date of Patent: Apr. 2, 2024

(54) ELEVATOR WITH A MONITORING ARRANGEMENT FOR MONITORING AN INTEGRITY OF SUSPENSION MEMBERS (71) Applicant: Inventio AG, Hergiswil (CH)

(72) Inventors: Vincent Robibero, Randolph, NJ (US); Philippe Henneau, Zürich (CH)

(73) Assignee: INVENTIO AG, Hergiswil (CH)

( * ) Notice: Subject to any disclaimer, the term of this patent is extended or adjusted under 35 U.S.C. 154(b) by 1281 days.

(21) Appl. No.: 16/476,569

(22) PCT Filed: Jun. 21, 2017

(86) PCT No.: PCT/EP2017/065253
§ 371 (c)(1),
(2) Date: Jul. 9, 2019

(87) PCT Pub. No.: WO2018/141422
PCT Pub. Date: Aug. 9, 2018

(65) Prior Publication Data
US 2019/0337761 A1 Nov. 7, 2019

(30) Foreign Application Priority Data

Apr. 18, 2017 (EP) ..................................... 17166927
Apr. 18, 2017 (EP) ..................................... 17166943

(51) Int. Cl.
B66B 7/12 (2006.01)
B66B 5/00 (2006.01)
G01R 31/08 (2020.01)

(52) U.S. Cl.
CPC .......... B66B 7/1223 (2013.01); B66B 5/0031 (2013.01); G01R 31/08 (2013.01)

(58) Field of Classification Search
CPC ...... B66B 7/1223; B66B 5/0031; G01R 31/08
See application file for complete search history.

(56) References Cited

U.S. PATENT DOCUMENTS 7,123,030 B2  10/2006 Robar et al.
7,410,033 B2   8/2008 Veronesi et al.
(Continued)

FOREIGN PATENT DOCUMENTS

CN  203657746 U  6/2014
CN  105700276 A  6/2016
(Continued)

OTHER PUBLICATIONS

Huaming Lei et al. "Health Monitoring for Coated Steel Belts in an Elevator System." Journal of Sensors, vol. 2012, Article ID 750261, 5 pages, doi: 10.1155/2012/750261.

Primary Examiner — Jeffrey Donels
(74) Attorney, Agent, or Firm — William J. Clemens; Shumaker, Loop & Kendrick, LLP (57) ABSTRACT An elevator suspension member arrangement includes at least two suspension members having electrically conductive cords. A monitoring arrangement generates first and second alternating voltages phase shifted by 180° and includes a plurality of input connectors and output connectors electrically connected to the cords and a voltage analyzer arrangement analyzing a neutral point voltage resulting from applying the voltages to the cords. Each suspension member can have the cords connected in parallel between the input connector and the output connector or have two groups of the cords connected in series between the connectors with the groups connected to an interconnecting connector. A multiplexer arrangement can be used to selectively test each pair of suspension members when the suspension member arrangement includes more than two suspension members.

10 Claims, 3 Drawing Sheets (56) References Cited

U.S. PATENT DOCUMENTS

| | | |
|---|---|---|
| 8,011,479 B2 | 9/2011 | Stucky et al. |
| 8,424,653 B2 | 4/2013 | Stucky et al. |
| 9,254,985 B2 | 2/2016 | Nolting et al. |
| 9,862,572 B2 * | 1/2018 | Fargo ............... G01N 27/041 |
| 9,932,203 B2 | 4/2018 | Robibero et al. |
| 2008/0223668 A1 | 9/2008 | Stucky et al. |
| 2010/0141267 A1 | 6/2010 | Quinn |
| 2011/0284331 A1 | 11/2011 | Stucky et al. |
| 2013/0207668 A1 | 8/2013 | Fargo et al. |
| 2015/0381972 A1 | 12/2015 | Kowdle et al. |
| 2017/0029249 A1 | 2/2017 | Robibero |

FOREIGN PATENT DOCUMENTS

| | | | |
|---|---|---|---|
| EP | 1730066 B1 | 12/2006 | |
| EP | 1732837 B1 | 12/2006 | |
| EP | 3124425 A1 | 1/2017 | |
| EP | 3124986 A1 | 1/2017 | |
| EP | 3336036 A1 * | 6/2018 | ........... B66B 7/1223 |
| WO | 2011098847 A1 | 8/2011 | |
| WO | 2013135285 A1 | 9/2013 | |
| WO | WO-2014130028 A1 * | 8/2014 | ........... B66B 7/1223 |
| WO | 2016083507 A1 | 6/2016 | |
| WO | 2017137282 A1 | 8/2017 | |
| WO | 2017137307 A1 | 8/2017 | |
| WO | 2017021263 A1 | 9/2017 | |
| WO | 2018141422 A1 | 8/2018 | |

\* cited by examiner

ELEVATOR WITH A MONITORING ARRANGEMENT FOR MONITORING AN INTEGRITY OF SUSPENSION MEMBERS

FIELD

The present invention relates to an elevator with a monitoring arrangement and to a method for monitoring an integrity of suspension members in a suspension member arrangement.

BACKGROUND

Elevators typically comprise a car and, optionally, a counterweight which may be displaced for example within an elevator shaft or hoistway to different levels in order to transport persons or items for example to various floors within a building.

In a common type of elevators, the car and/or the counterweight are supported by a suspension member arrangement comprising several suspension member entities. A suspension member entity typically comprises a suspension member, a fixation arrangement for fixing the suspension member within the building and possibly other components which may be used e.g. upon monitoring an integrity of the suspension member. A suspension member may be a member which may carry heavy loads in a tension direction and which may be bent in a direction transverse to the tension direction. For example, a suspension member may be a rope or a belt. Typically, suspension members comprise a plurality of load carrying cords. The cords may be made for example with an electrically conductive material, particularly a metal such as steel. Such cords are typically embedded into an electrically isolating matrix material such as a polymer, the matrix material, inter alia, protecting the cords against e.g. mechanical damaging and/or corrosion.

During operation of the elevator, suspension members have to carry high loads and are typically repeatedly bent when running along for example a traction sheave, a pulley and/or other types of sheaves. Accordingly, substantial physical stress is applied to the suspension members during operation which may lead to deteriorations in the suspension members' physical characteristics such as e.g. their load bearing capability.

However, as elevators may typically be used by people for transportation along significant heights, safety requirements have to be fulfilled. For example, it has to be safeguarded that the suspension member arrangement can always guarantee safe support of the car and/or the counterweight. For such purposes, safety regulations rule for example that substantial deterioration of an initial load bearing capacity of a suspension member arrangement can be detected such that for example counter-measures such as replacing a substantially deteriorated or faulty suspension member from the suspension member arrangement may be initiated.

For example, various approaches to be used upon monitoring suspension members in an elevator have been described in EP 1 730 066 B1, U.S. Pat. No. 7,123,030 B2, US 2011/0284331 A1, U.S. Pat. No. 8,424,653 B2, US 2008/0223668 A1, U.S. Pat. No. 8,011,479 B2, US 2013/0207668 A1, WO 2011/098847 A1, WO 2013/135285 A1, EP 1 732 837 B1, and in a research article of Huaming Lei et al.: "Health Monitoring for Coated Steel Belts in an Elevator System" in the Journal of Sensors, Volume 2012, Article ID 750261, 5 pages, doi: 10.1155/2012/750261. Most of these prior art approaches are generally based on measuring electrical resistance characteristics upon applying an electrical direct current (DC).

Further approaches for methods and devices for detecting deteriorations in load bearing suspension members of an elevator have been proposed by the present applicant, these approaches relying on AC voltage measurements. These approaches have been described by the present applicant inter alia in PCT/EP2016/067966, EP 16155357.3, EP 16155358.1, PCT/EP2017/052064, PCT/EP2017/052281 and EP 17166927. Furthermore, the applicant of the present application has filed a U.S. provisional application 62/199,375 and a US non-provisional application U.S. Ser. No. 14/814,558 (now U.S. Pat. No. 9,932,203 B2) which relate to a more generalized approach for determining deteriorations in a suspension member arrangement for an elevator. All these documents are herein later on referred to as "the applicant's prior art". It shall be emphasized that many technical details of the "applicant's prior art" may also be applied to the present invention and that some technical characteristics of the present invention may be better understood upon studying "the applicant's prior art". Accordingly, the content of the "applicant's prior art" shall be incorporated herein by reference.

In the approaches used for monitoring a deterioration state in suspension members, particularly in those approaches described in the applicant's prior art, electrical AC voltages have to be applied to various cords within the suspension members. For such purpose, connectors are generally attached to a suspension member and electrically contact the cords embedded therein.

There may be a need for an improvement in and/or an alternative for an elevator, a monitoring device to be used in such elevator and a method to be implemented by such monitoring device for monitoring an integrity status of a suspension member arrangement.

SUMMARY

According to a first aspect of the invention, an elevator comprises a suspension member arrangement and a monitoring arrangement. The suspension member arrangement comprises at least a first and a second suspension member, each suspension member comprising electrically conductive cords. The monitoring arrangement is configured for monitoring an integrity status of the suspension member arrangement. Particularly, the monitoring arrangement comprises an alternating voltage generator arrangement, a plurality of input connectors and output connectors and a voltage analyzer arrangement. The alternating voltage generator arrangement is configured for generating first and second alternating voltages being phase shifted by 180° with respect to each other. The plurality of input connectors and output connectors are each configured for establishing an electrical connection to cords comprised in one of the suspension members. The voltage analyzer arrangement is configured for analyzing a neutral point voltage resulting upon applying each one of the first and second alternating voltages to cords of one of the first and second suspension members, respectively, and after transmission of the first and second alternating voltages through the cords and superimposing the transmitted first and second alternating voltages. Therein, a first input connector and a second input connector are electrically connected to the alternating voltage arrangement and a first output connector and a second output connector are electrically connected to the voltage analyzer arrangement. Furthermore, for the first suspension member, the first input connector and first output connector establish a first circuitry in which the first voltage is applied via the first input connector to a first end of at least some of the cords comprised in the first suspension member and, after transmission of the voltage through all cords of the first suspension member, is further transmitted via the first output connector to the voltage analyzer. Similarly, for the second suspension member, the second input connector and second output connector establish a second circuitry in which the second voltage is applied via the second input connector to a first end of at least some of the cords comprised in the second suspension member and, after transmission of the voltage through all cords of the second suspension member, is further transmitted via the second output connector to the voltage analyzer.

According to a second aspect of the invention, a monitoring arrangement for monitoring an integrity status of the suspension member arrangement of an elevator is proposed. Therein, the suspension member arrangement and the monitoring arrangement are provided with features as correspondingly defined above with respect to the first aspect of the invention. Particularly, the monitoring arrangement comprises a first input connector and a first output connector which are adapted such as to establish a first circuitry in which the first voltage is applied via the first input connector to a first end of at least some of the cords comprised in the first suspension member and, after transmission of the voltage through all cords of the first suspension member, is further transmitted via the first output connector to the voltage analyzer. Similarly, the monitoring arrangement comprises a second input connector and second output connector which are adapted such as to establish a second circuitry in which the second voltage is applied via the second input connector to a first end of at least some of the cords comprised in the second suspension member and, after transmission of the voltage through all cords of the second suspension member, is further transmitted via the second output connector to the voltage analyzer.

According to a third aspect of the invention, a method for monitoring an integrity status of the suspension member arrangement of an elevator is proposed. Again, the suspension member arrangement comprises at least a first and a second suspension member, each suspension member comprising electrically conductive cords. The method comprises the following steps: (i) establishing an electrical connection to cords comprised in one of the suspension members via a plurality of input connectors and output connectors; (ii) generating first and second alternating voltages being phase shifted by 180° with respect to each other via an alternating voltage generator arrangement; and (iii) using a voltage analyzer arrangement for analyzing a neutral point voltage resulting upon applying each one of the first and second alternating voltages to cords of one of the first and second suspension member, respectively, and after transmission of the first and second alternating voltages through the cords and superimposing the transmitted first and second alternating voltages. Therein, a first input connector and a second input connector are electrically connected to the alternating voltage arrangement and a first output connector and a second output connector are electrically connected to the voltage analyzer arrangement. For the first suspension member, the first input connector and first output connector are adapted such as to establish a first circuitry in which the first voltage is applied via the first input connector to a first end of at least some of the cords comprised in the first suspension member and, after transmission of the voltage through all cords of the first suspension member, is further transmitted via the first output connector to the voltage analyzer. Similarly, for the second suspension member, the second input connector and second output connector are adapted such as to establish a second circuitry in which the second voltage is applied via the second input connector to a first end of at least some of the cords comprised in the second suspension member and, after transmission of the voltage through all cords of the second suspension member, is further transmitted via the second output connector to the voltage analyzer.

Ideas underlying embodiments of the present invention may be interpreted as being based, inter alia and without restricting a scope of the invention, on the following observations and recognitions:

As indicated in the introductory portion further above, inventors of the applicant have developed various details of a novel approach for monitoring an integrity status of a suspension member arrangement in an elevator (see "applicant's prior art"), wherein alternating voltages being phase-shifted with respect to each other are applied to various cords or groups of cords in the suspension member arrangement. Therein, in the prior approaches described in the applicant's prior art, at least two groups of cords had been included in each of the suspension members. Particularly, in one approach, a first group of cords comprises all even numbered cords in a belt which are connected in a first series connection and a second group of cords comprises all odd numbered cords which are connected in a second series connection. In another approach, a first group of cords comprises all cords in a first half of a suspension member and a second group of cords comprises all cords in a second half of the same suspension member. In all such approaches, a first alternating voltage is applied to a first group of cords and a second phase-shifted alternating voltage is applied to a second group of cords in the same or another one of the suspension members. The first and second groups of cords are then electrically interconnected such that, at a location which is generally referred to as "neutral point", a superposition of the applied first and second alternating voltages after transmission through the first and second group of cords, respectively, may be measured. The voltage resulting from such superposition is typically referred to as neutral point voltage. Analyzing such neutral point voltage may provide valuable information about a current integrity status of the suspension member arrangement. For example, an increase in an electrical resistance of one of the cords due to for example local corrosion or even an interruption of one of the cords may reliably be revealed upon analyzing the neutral point voltage. Similarly, short-circuits between cords and/or electrical connections between a cord and for example an electrically conductive pulley or sheave may be detected.

It has been found that with embodiments of the present invention, the prior art approaches may be improved at least in some respects. Particularly, a circuitry may be simplified and/or a reliability upon detecting any deteriorations in the integrity status of the suspension member arrangement may be increased.

The monitoring arrangement included in an elevator and used in a method according to embodiments of the present invention comprises an alternating voltage generator arrangement, several connectors and a voltage analyzer arrangement. The alternating voltage generator arrangement and the voltage analyzer arrangement may in general be similar or identical to corresponding arrangements as applied in the applicant's prior art approaches.

Particularly, the alternating voltage generator arrangement may for example comprise two alternating voltage generators for generating the first and second alternating voltages which may have a same waveform, i.e. inter-alia same frequency and same amplitude, but which are phase-shifted by 180° with respect to each other. Alternatively, the alternating voltage generator arrangement may comprise a single alternating voltage generator having two output ports with a second output port outputting an inversed alternating voltage, i.e. an alternating voltage being offset by a 180° phase-shift with respect to an alternating voltage output at a first output port.

The voltage analyzer arrangement may comprise one, two or more voltmeters for measuring an electrical voltage at the neutral point, i.e. the neutral point voltage resulting upon superimposing the first alternating voltage after transmission through a first group of cords with the second alternating voltage after transmission through a second group of cords. The neutral point voltage may be measured with reference to a predetermined electrical potential such as a ground potential. Alternatively, the neutral point voltage may be measured along a reference electrical resistance. Details on possible implementations of the voltage analyzer arrangement may be obtained from the applicant's prior art.

The approach of the present invention differs from prior art approaches particularly with respect to circuitries including the cords of the suspension member arrangement. Particularly, the input connectors and output connectors shall be adapted such that each single suspension member includes or forms only a single circuitry interconnecting the alternating voltage generator arrangement, at the one end, with the voltage analyzer arrangement, at the other end.

In other words, in the prior art approaches, each suspension member included at least two groups of cords, each group forming part of a circuitry for interconnecting the alternating voltage generator arrangement with the voltage analyzer arrangement. Accordingly, the cords of each suspension member formed part of two such circuits. In contrast hereto, according to embodiments of the present invention, all cords of each single suspension member shall form only a single group of cords forming part of a circuitry for interconnecting the alternating voltage generator arrangement with the voltage analyzer arrangement. Therein, in the single group of cords, the cords may be either connected in parallel or connected in series. Or, as a further preferred alternative, some of the cords in a single suspension member are connected in parallel and are then connected in series to another multiplicity of cords also being connected in parallel.

With the approach described herein, relatively simple input connectors and output connectors may be used for contacting the cords in a suspension member and electrically connecting them to the alternating voltage generator arrangement, on the one side, and to the voltage analyzer arrangement, on the other side. Furthermore, an integrity of each of multiple suspension members may be monitored reliably and with reduced wiring or contacting efforts.

According to an embodiment, the first and second input connectors each are connected to one of the first and second suspension members at a first end region thereof and the first and second output connectors each are connected to the one of the first and second suspension members at an opposing second end region thereof. Therein, the input connectors and output connectors each contact and interconnect in parallel all of the cords comprised in one of the first and second suspension members.

In other words, the first input connector shall be attached to the first suspension member and shall electrically contact each of the cords in the first suspension member in a first end region thereof. Similarly, the first output connector shall be attached to the first suspension member and shall electrically contact each of the cords in the first suspension member in an opposing second end region. Same is true for the second input connector and the second output connector contacting all the cords comprised in the second suspension member. Therein, each of the input and output connectors electrically interconnects the cords comprised in the suspension member contacted by the respective connector. Accordingly, all cords comprised in a single suspension member are interconnected in parallel and may form part of a single circuitry for connecting the alternating voltage generator arrangement with the voltage analyzer arrangement at the neutral point.

Such connection scheme may be particularly simple and easy to implement. Particularly, the input and output connectors may be simply adapted for electrically contacting all of the cords in a single suspension member such that for example no precise alignment of for example contact pins at the connector with associated cords is needed. Furthermore, as all cords of one suspension member are included in a common parallel interconnection scheme, there is no risk of any disturbing short-circuits between cords comprised in separate groups of cords.

According to another embodiment, the first and second input connectors each are connected to respective first partial groups of cords in one of the first and second suspension members at a first end region thereof and the first and second output connectors each are connected to respective second partial groups of the one of the first and second suspension members at the first end region thereof. Furthermore, first and second interconnecting connectors are provided and each of the interconnecting connectors is connected to the respective first and second partial groups of cords in one of the first and second suspension members at an opposing second end region thereof. Therein the first and second input connectors each contact and interconnect in parallel all of the cords comprised in the first group of cords of one of the first and second suspension members. The first and second output connectors each contact and interconnect in parallel all of the cords comprised in the second group of cords of one of the first and second suspension members. The first and second interconnecting connectors each contact and interconnect in parallel all of the cords comprised in the first and second groups of cords of one of the first and second suspension members.

In other words, for example at the first suspension member, the first input connector may be connected to a first partial group of cords and the first output connector may be connected to a second partial group of cords. The combination of both the first and second groups of cords may correspond to the sum of all cords comprised in the first suspension member. Therein, the first input connector and the first output connector are attached to the first suspension member at a first end region thereof. At an opposing second end region of the first suspension member, the first interconnecting connector is provided. This first interconnecting connector differs from the first input connector and the second input connector in that it not only contacts the cords of one of the first and second partial group of cords. In contrast, the interconnecting connector contacts the cords included in both, the first and second partial group of cords, and electrically interconnects them. Accordingly, in such circuitry, a series connection between the first partial group of cords contacted by the first input connector and the second partial group of cords contacted by the first output connector is established by the first interconnecting connector. A similar circuitry is established for the second suspension member, this circuitry comprising the second input connector, second output connector and second interconnecting connector.

Accordingly, in contrast to the preceding embodiment, in the latter embodiment not all of the cords in a suspension member are connected in parallel. Instead, only the cords comprised in each of the first and second partial groups of cords are connected in parallel and the first and second groups of cords are then connected in series via the interconnecting connector.

Therefore, an overall electrical resistance throughout the series connection of the first partial group of cords and the second partial group of cords is substantially higher than in the case of the preceding embodiment with all of the cords in one suspension member being connected in parallel. Accordingly, with such higher overall electrical resistance, any deterioration in the integrity state of the suspension member may be detected easier and/or more reliably.

However, it may be noted that in both, the preceding and the latter embodiments, all of the cords comprised in a single suspension member form part of a single circuitry for connecting the alternating voltage generator arrangement with the voltage analyzer arrangement.

According to an embodiment, the suspension member arrangement comprises more than two suspension members. In such case, the elevator further comprises a multiplexer arrangement configured for selectively electrically connecting the alternating voltage generator arrangement to exactly two of the suspension members.

In other words, as is commonly the case for most elevators, the suspension member arrangement comprises a multiplicity of suspension members. For example, modern elevators typically comprise four, six, eight or even more belts or ropes. In such case, it may be beneficial to enable using the same alternating voltage generator arrangement and voltage analyzer arrangement for monitoring an integrity state of each of the multiple suspension members.

Accordingly, as in accordance with embodiments of the present invention, each single suspension member shall form with its cords a circuitry for interconnecting the alternating voltage generator arrangement with the voltage analyzer arrangement, a multiplexer arrangement may be provided which allows selectively connecting the alternating voltage generator arrangement to a variety of possible couples of suspension members.

For example, the multiplexer arrangement may be adapted for selectively establishing an electrical connection between a first voltage generator and a first one of the input connectors and an additional electrical connection between a second voltage generator and a second one of the input connectors. In that case, each of the input connectors indirectly or directly electrically contacts all of the cords comprised in one of the multiple suspension members. As the output connectors attached to the suspension members currently being selectively contacted via the multiplexer arrangement may be connected to the voltage analyzer arrangement, using such multiplexer arrangement may allow sequentially testing an integrity of each of the couples of suspension members.

Particularly, according to an embodiment, the multiplexer arrangement is further configured for selectively electrically connecting the voltage analyzer arrangement to the exactly two of the suspension members.

In other words, the multiplexer arrangement may not only selectively interconnect the alternating voltage generator arrangement with two of the suspension members but may also electrically interconnect the selected two of the suspension members with the voltage analyzer arrangement. Accordingly, using the multiplexer arrangement, the first and second alternating voltages generated by the alternating voltage generator arrangement may be selectively applied to an arbitrary pair of a multiplicity of possible pairs of first and second suspension members such that the suspension members of this pair form circuitries for transmitting the applied voltages to the neutral point where the neutral point voltage may be measured using the voltage analyzer arrangement.

According to an embodiment, a first one of the suspension members is fixedly electrically connected to the alternating voltage generator arrangement and to the voltage analyzer arrangement. In such case, the multiplexer may be configured for selectively electrically connecting one of the remaining suspension members to the alternating voltage generator arrangement.

Expressed differently, if the suspension member arrangement comprises three or more suspension members and a multiplexer arrangement is applied in order to sequentially connect different pairs of suspension members to the alternating voltage generator arrangement and to the voltage analyzer arrangement, it may be beneficial to have one of the suspension members fixedly connected to the alternating voltage generator arrangement and to the voltage analyzer arrangement whereas the remaining suspension members may be connected to the alternating voltage generator arrangement and the voltage analyzer arrangement only via the multiplexer arrangement.

In such configuration, the fixedly connected suspension member may serve as a kind of reference suspension member against which all of the remaining suspension members may be sequentially tested. Accordingly, in a testing procedure, for example a first one of the remaining suspension members is connected to the alternating voltage generator arrangement and to the voltage analyzer arrangement in a first switching state of the multiplexer arrangement. Upon analyzing the neutral point voltage, it may be tested whether both suspension members have for example substantially equal electrical characteristics such that an AC component of the neutral point voltage is zero. After such first step, a second one of the remaining suspension members may be connected to the alternating voltage generator arrangement and to the voltage analyzer arrangement instead of the first one of the remaining suspension members, such that this second one of the suspension members may be tested in a similar manner. A same procedure may be repeated for all of the remaining suspension members.

In the end, if all tests in such procedure reveal that the reference suspension member and the remaining suspension members have same electrical characteristics for example resulting in a neutral point voltage being zero, an integrity of the entire suspension member arrangement may be confirmed. However, if one of such tests reveals a difference in electrical characteristics between the tested remaining suspension member and the reference suspension member, a modification in electrical characteristics of the remaining suspension member may be assumed. If all of the tests reveal a difference between electrical characteristics of the tested remaining suspension member and the reference suspension member, a modification in electrical characteristics of the reference suspension member may be assumed.

According to a specific implementation of the previous embodiment, each of the remaining suspension members is fixedly electrically connected to the voltage analyzer arrangement.

In other words, while, using the multiplexer arrangement, the alternating voltage generator arrangement may be selectively connected to one of the input connectors attached to first ends of each one of the remaining suspension members, opposing ends of all of the remaining suspension members may be collectively connected via respective output connectors to the voltage analyzer arrangement. This means that a fixed electrical wiring may be provided between the output connectors attached to the remaining suspension members. Accordingly, a complexity of the multiplexer arrangement may be limited to what is needed for selectively connecting the alternating voltage generator arrangement to one of the remaining suspension members.

Particularly, according to a specific implementation of the previous embodiment, the output connectors contacting each of the remaining suspension members are electrically interconnected in parallel with each other. Such parallel interconnection of all output connectors at the remaining suspension members may be easily established using for example hardwiring interconnecting all of the output connectors and furthermore establishing an electrical connection to the voltage analyzer arrangement.

It shall be noted that possible features and advantages of embodiments of the invention are described herein partly with respect to an elevator comprising a monitoring device, partly with respect to the monitoring device itself and partly with respect to a method for monitoring an integrity status of a suspension member arrangement. One skilled in the art will recognize that the features may be suitably transferred from one embodiment to another and features may be modified, adapted, combined and/or replaced, etc. in order to come to further embodiments of the invention.

In the following, advantageous embodiments of the invention will be described with reference to the enclosed drawings. However, neither the drawings nor the description shall be interpreted as limiting the invention.

The figures are only schematic representations and are not to scale. Same reference signs refer to same or similar features throughout the figures.

DETAILED DESCRIPTION

Figure 1:
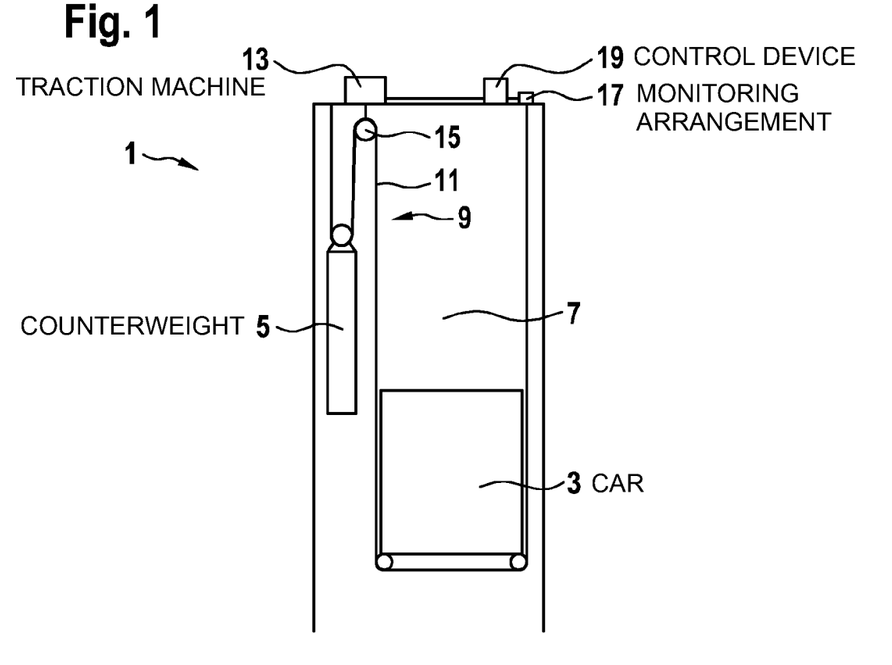
FIG. 1 shows an elevator in which a monitoring arrangement according to an embodiment of the invention may be applied.

FIG. 1 shows an elevator 1 in which a monitoring device or arrangement 17 may be implemented in accordance with embodiments of the present invention.

The elevator 1 comprises a car 3 and a counterweight 5 which may be displaced vertically within an elevator shaft 7. The car 3 and the counterweight 5 are suspended by a suspension member arrangement 9. This suspension member arrangement 9 comprises multiple suspension members 11, sometimes also referred to as suspension traction media (STM). Such suspension members 11 may be for example ropes, belts, etc. Furthermore, the elevator 1 comprises additional components such as, inter-alia, the monitoring arrangement 17 for monitoring an integrity or deterioration status of the suspension members 11 in the suspension member arrangement 9.

In the example shown in FIG. 1, end portions of the suspension members 11 are fixed to a supporting structure of the elevator 1 at a top of the elevator shaft 7. The suspension members 11 may be displaced using an elevator traction machine 13 driving a traction sheave 15. An operation of the elevator traction machine 13 may be controlled by a control device 19.

It may be noted that the elevator 1 and particularly its suspension member(s) 11 and its monitoring arrangement 17 for detecting the deterioration status may be configured and arranged in various other ways than those shown in FIG. 1. For example, instead of being fixed to the support structure of the elevator 1, the end portions of the suspension members 11 may be fixed to the car 3 and/or to the counterweight 5.

The suspension members 11 to be driven for example by the traction machine 13 may utilize metal cords or ropes to support a suspended load such as the car 3 and/or the counterweight 5 that is moved by the traction machine 13.

Figure 2:
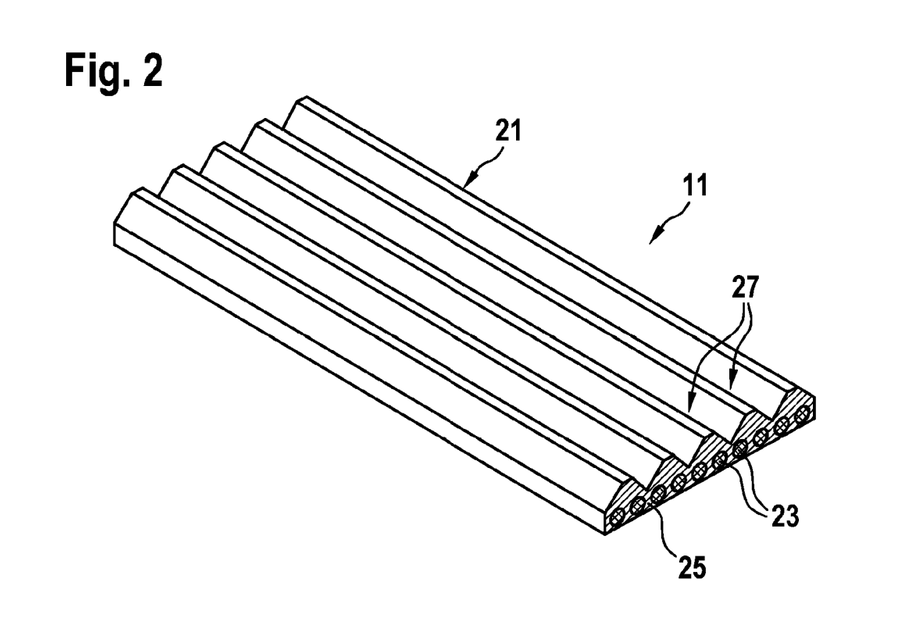
FIG. 2 shows a suspension member for an elevator.

FIG. 2 shows an example of a suspension member 11 which is embodied with a belt 21. The belt 21 comprises a plurality of cords 23 which are arranged parallel to each other and spaced from each other. The cords 23 are enclosed in a matrix material 25 forming, inter alia, a coating. Such coating may mechanically couple neighboring cords 23. Furthermore, the matrix material 25 may protect the cords 23 for example against corrosion and/or abrasion. The coating may have a textured or profiled surface including longitudinal guiding grooves 27. The cords 23 may typically consist of or comprise wires or strands made from a metal such as steel. The matrix material 25 may consist of or comprises a plastic or elastomeric material, for example a polymer. Accordingly, the cords 23 are typically electrically conductive such that an electric voltage may be applied to and/or an electric current may be fed through the cords 23 without significant losses. Furthermore, the cords 23 are preferably electrically isolated from each other via the interposed electrically insulating matrix material 25 such that, as long as an integrity of the coating is not deteriorated, an electrical current or voltage between neighboring cords cannot be transmitted, i.e. no significant shunt current can flow from one cord 23 to another.

Alternatively, suspension members 11 may have other shapes or configurations. For example, a belt may have several cords included into a body formed of matrix material, the body being non-profiled (i.e. flat) or having other shapes as those shown in FIG. 2. Generally, the suspension members 11 may be provided as coated steel suspension members.

As the integrity of the suspension member 11 is mandatory for the safety of the elevator 1, such integrity has to be continuously or repeatedly monitored in order to reliably detect any deterioration therein. For such purpose, the monitoring arrangement 17 may apply electric voltages to the cords 23 and may analyze resulting voltages occurring at another position along the length of the suspension member 11.

Details on how to apply and analyze such electric voltages are disclosed in the "applicant's prior art" and shall only be briefly summarized herein. Generally, two alternating voltages having same waveforms but being shifted by 180° with respect to each other are applied to two different cords or groups of cords. The applied voltages are transmitted through the cords or groups of cords and at opposing ends are superimposed to each other. The resulting voltage is referred to as neutral point voltage as at that neutral point, both shifted alternating voltages should neutralize each other as long as electrical characteristics through both cords or groups of cords are same. Accordingly, under normal circumstances, the neutral point voltage should have a zero alternating voltage component. However, upon any deteriorations in the cords modifying their electrical characteristics, such modifications generally lead to a lacking neutralization of the phase shifted alternating voltages such that the resulting non-zero neutral point voltage may serve as a good indicator for any change in an integrity status of the suspension member arrangement 9. The generation and application of the alternating voltages at the one end of the cords or groups of cords as well as the analysis of the resulting voltage at the neutral point may be performed by the monitoring arrangement 17.

In order to enable applying electric voltages to the cords 23 embedded in the matrix material 25, connectors have to be attached to the suspension member 11. Such connectors, on the one hand, should be configured for reliable mechanical attachment on the suspension member 11. On the other hand, such connectors shall provide for an electrical connection with the embedded cords 23.

Figure 3:
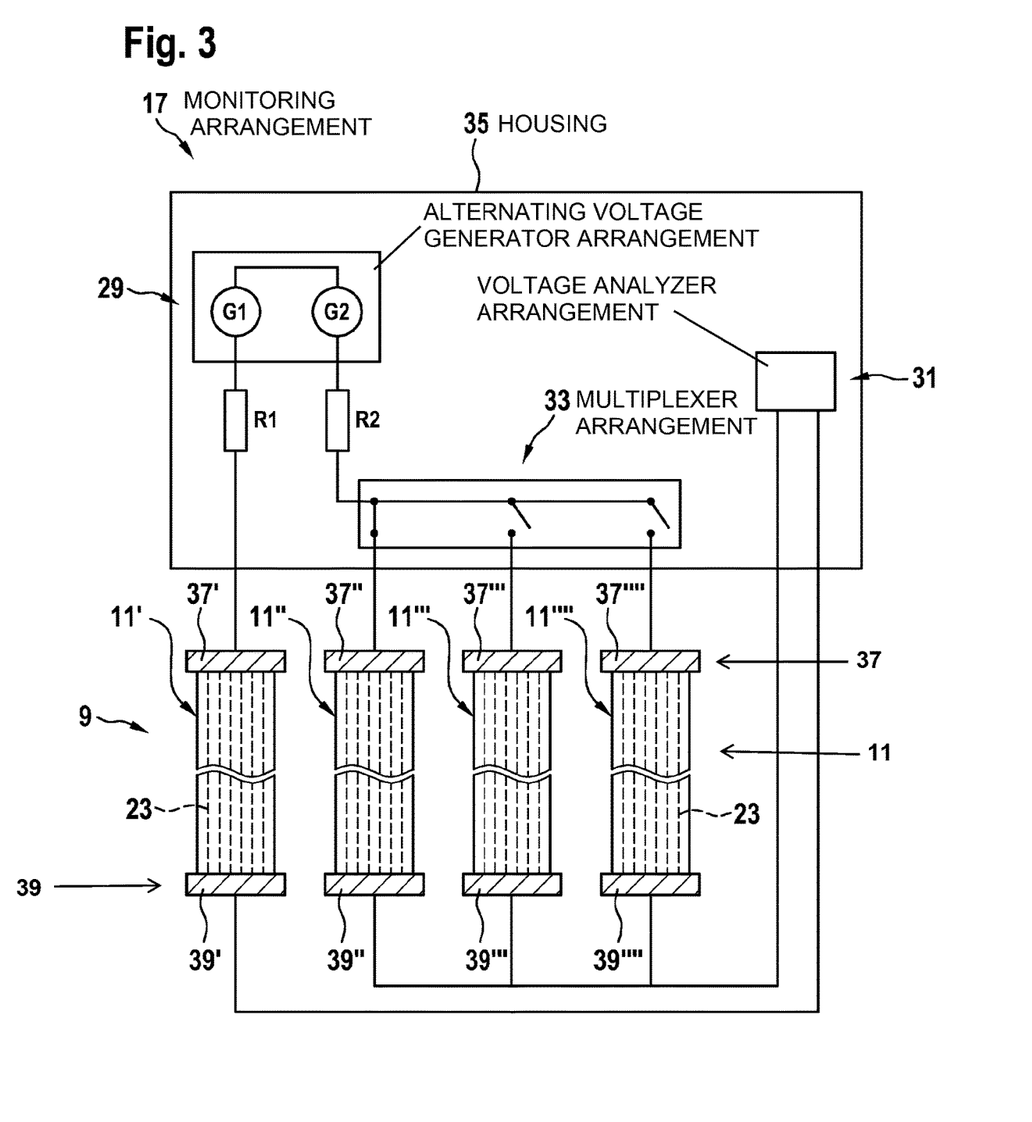
FIG. 3 shows a monitoring arrangement according to an embodiment of the invention as applied to a suspension member arrangement.
Figure 4:
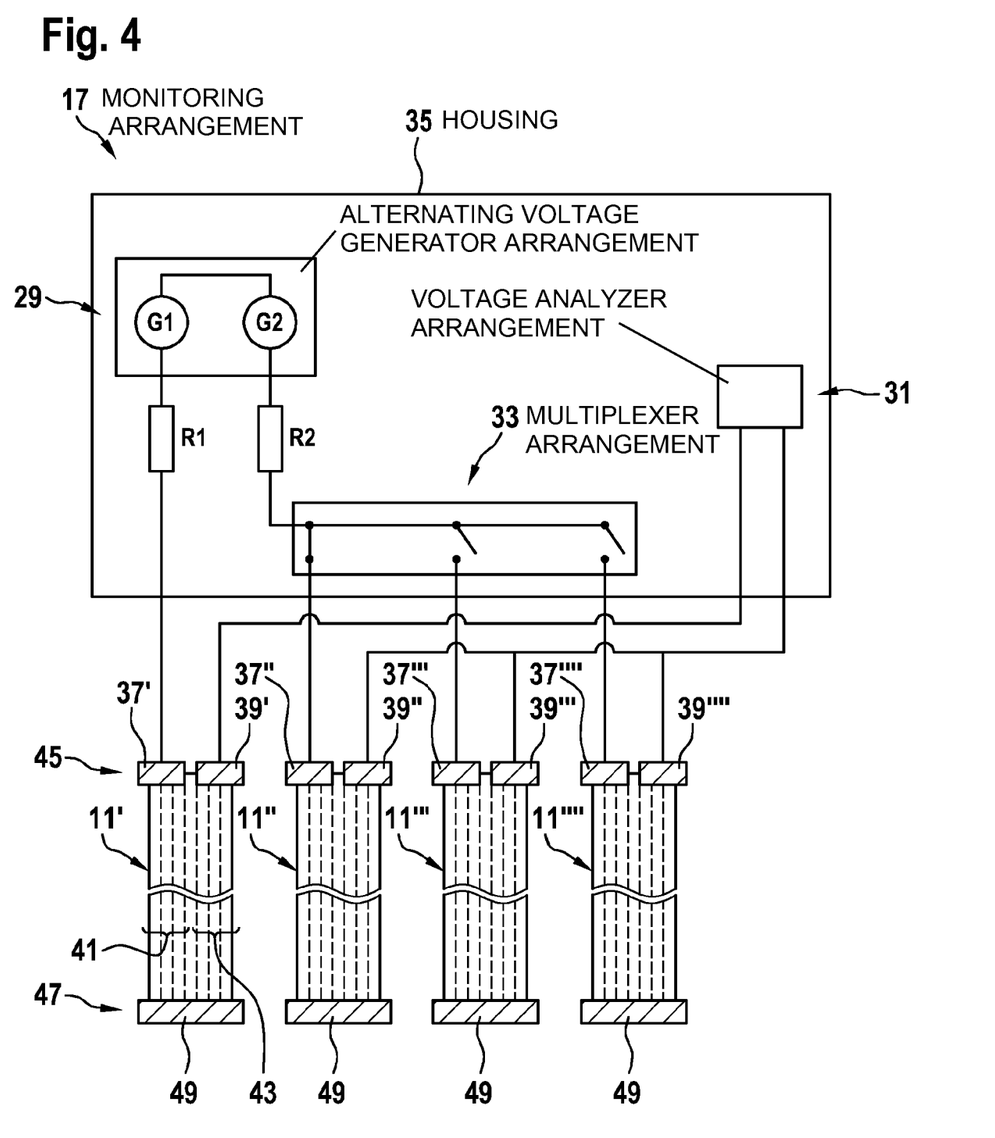
FIG. 4 shows a monitoring arrangement according to another embodiment of the invention as applied to a suspension member arrangement.

FIGS. 3 and 4 show embodiments of the monitoring arrangement 17 attached to a suspension member arrangement 9 exemplarily comprising four suspension members 11 (11', 11", 11''', 11''''). Each of the suspension members 11 comprises a multiplicity of internal electrically conductive cords 23 indicated by dashed lines.

The monitoring arrangement 17 comprises an alternating voltage generator arrangement 29, a voltage analyzer arrangement 31 and a multiplexer arrangement 33. All these components may be comprised in a common housing 35. Furthermore, the monitoring arrangement 17 comprises a multiplicity of input connectors 37 (37', 37", 37''', 37'''') and output connectors 39 (39', 39", 39''', 39''''), each of which establishes an electrical connection to the cords 23 embedded in one of the suspension members 11.

The alternating voltage generator arrangement 29 comprises two alternating voltage generators G1 and G2 which are adapted and synchronized such as to generate first and second alternating voltages being phase-shifted by 180° with respect to each other. The alternating voltage generators G1 and G2 each are electrically connected to an associated one of the input connectors 37', 37" attached to one of the suspension members 11', 11" at a proximal end thereof. Intermittent electrical resistances R1, R2 are interposed between the alternating voltage generators G1, G2 and the first and second input connectors 37', 37".

The voltage analyzer arrangement 31 generally comprises one or more voltmeters and some analyzing logics for computing and/or evaluating measurement results of the voltmeter(s). Details of possible implementations of such voltage analyzer arrangement 31 are described in the applicant's prior art and shall not be repeated here in detail.

The voltage analyzer arrangement 31 is connected to first and second output connectors 39', 39". Accordingly, after having been transmitted through the cords 23 in the suspension members 11', 11", the phase-shifted first and second alternating voltages applied to these suspension members 11', 11" are further applied to the voltage analyzer arrangement 31, which may then measure the neutral point voltage.

In both embodiments shown in FIGS. 3 and 4, the circuitry formed by the input and output connectors 37', 39' attached to the suspension members 11 is established such that the alternating voltage generated by one of the generators G1, G2 is transmitted through all of the cords 23 comprised in a single one of the suspension members 11', 11".

Therein, in the embodiment of FIG. 3, the input connectors 37 are each attached to a proximal end portion of the associated suspension members 11 and are adapted such as to contact all of the cords 23 of this suspension member 11. Similarly, the output connectors 39 are each attached to the distal end portion of an associated one of the suspension members 11 and are adapted to contact all of the cords of this suspension member 11. Particularly, the input connectors 37 as well as the output connectors 39 interconnect all of the cords 23 in one suspension member 11 in parallel. Accordingly, each single one of the suspension members 11 forms with its included cords 23 a portion of a single circuitry for interconnecting the alternating voltage generator arrangement 29, on the one side, with the voltage analyzer arrangement 31, on the other side.

In the embodiment of FIG. 4, the input connectors 37 and output connectors 39 are not attached to opposing end portions 45, 47 of the suspension members 11, in contrast to the embodiment of FIG. 3. Instead, the input connectors 37 as well as the output connectors 39 are attached to the suspension member 11 at the proximal end portion 45 thereof. Therein, the input connectors 37 do not contact all of the cords 23 of the suspension member 11 but only contact a first group 41 of cords 23 of this suspension member 11. The output connector 39 then contacts the remaining cords 23 comprised in a second group 43 of cords 23.

At an opposing distal end portion 47, an interconnecting connector 49 electrically interconnects all of the cords 23 comprised in the first and second groups 41, 43 of cords. Accordingly, this interconnecting connector 49 connects the first group 41 of cords 23 in series with the second group 43 of cords 23.

With such arrangement, an overall series resistance through the circuitry formed by the series connection of first and second groups 41, 43 of cords 23 may be substantially doubled as compared to the embodiment shown in FIG. 3. Accordingly, any deviation from a neutralized situation in which the neutral point voltage is zero may be detected with higher accuracy and/or with a simpler voltage analyzer arrangement 31.

Furthermore, the embodiment shown in FIG. 4 allows that both, the input connectors 37 and the output connectors 39 are attached to a same end portion 45 of the suspension members 11, thereby possibly simplifying any wiring efforts.

Expressed in other words, in the embodiments shown in FIGS. 3 and 4, an arrangement of cords 23 in a suspension member 11 may be such that the cords 23 are connected entirely in parallel or as a set of serially connected groups 41, 43 of cords that are in parallel. When additional electrical signal strength is required for example due to a length of the suspension member 11, a number of serially connected sets of cords 23 that are in parallel may be increased in the suspension member with the connectors.

It may be noted that, generally, more than two phases may be employed by the monitoring arrangement 17 to monitor for suspension members 11. But since a minimum of two suspension members 11 is possible in some international settings, a two-phase approach may be preferred.

In the embodiments shown in FIGS. 3 and 4, the suspension members 11 are not statically connected to the monitoring arrangement 17. Instead, the monitoring arrangement 17 comprises the multiplexer arrangement 33 which may selectively electrically interconnect the alternating voltage generator arrangement 29 with exactly two of the suspension members 11.

Therein, in the embodiment shown, only the input connectors 37 are connected to the multiplexer arrangement 33 and may therefore selectively be connected to the alternating voltage generator arrangement 29. The output connectors 39 are statically connected to the voltage analyzer arrangement 31.

Particularly, the first suspension member 11' is fixedly electrically connected to the alternating voltage generator arrangement 29, more specifically to the first generator G1. The remaining suspension members 11", 11'", 11"" are all connected to the multiplexer arrangement 33 which may further connect them selectively to the alternating voltage generator arrangement 29, more specifically to the second generator G2. Thus, the first suspension member 11' may serve as a reference and may form a pair selectively with each of the remaining suspension members 11", 11'", 11"", depending on the current configuration of the multiplexer arrangement 33. Accordingly, by analyzing the neutral point voltage for each of the multiplexer's 33 configuration, each of the remaining suspension members 11", 11'", 11"" may be tested against the reference first suspension member 11'.

To simplify any wiring between the monitoring arrangement 17 and the suspension member arrangement 9, the output connectors 39", 39'", 39"" at all of the remaining suspension members 11", 11'", 11"" may be interconnected in parallel and may then be connected to the voltage analyzer arrangement 31.

In an alternative embodiment (not shown), all of the suspension members could be selectively interconnected with the alternating voltage generator arrangement 29 and/or the voltage analyzer arrangement 31 via the multiplexer arrangement 33. In such configuration, each of the suspension members 11 could be tested against each of the other suspension members 11.

Expressed in other words, through multiplexing, the monitoring arrangement 17 may allow to accept any number of suspension members 11 to be monitored through common minimum circuitry by for example utilizing the first suspension member 11' as a reference when each additional suspension member 11", 11'", 11"" is switched into the common monitoring circuit.

Finally, some possible benefits to be achieved with embodiments of the invention shall be mentioned:
(i) the same minimal circuitry needed to monitor just two suspension members may be applied to monitor any number of suspension members;
(ii) A single point of measurement and related electronics may be used for two or more suspension members;
(iii) no calibration of separate measurements circuits is required for additional suspension members;
(iv) a connector arrangement for a number of parallel sets of cords in series can be used to scale the arrangement for the length of suspension members in an application.

Finally, it should be noted that the term "comprising" does not exclude other elements or steps and the "a" or "an" does not exclude a plurality. Also, elements described in association with different embodiments may be combined.

In accordance with the provisions of the patent statutes, the present invention has been described in what is considered to represent its preferred embodiment. However, it should be noted that the invention can be practiced otherwise than as specifically illustrated and described without departing from its spirit or scope.

LIST OF REFERENCE SIGNS 1 elevator
3 car
5 counterweight
7 elevator shaft
9 suspension member arrangement
11 suspension member (11', 11", 11'", 11"")
13 traction machine
15 traction sheave
17 monitoring arrangement
19 control device
21 belt
23 cords
25 matrix material
27 grooves
29 alternating voltage generator arrangement
31 voltage analyzer arrangement
33 multiplexer arrangement
35 housing of monitoring arrangement
37 input connector (37', 37", 37'", 37"")
39 output connector (39', 39", 39'", 39"")
41 first group of cords
43 second group of cords
45 proximal end region of suspension member
47 distal end region of suspension member
49 interconnecting connector
G1, G2 generator
R1, R2 resistance

The invention claimed is:

1. An elevator comprising:
a suspension member arrangement including at least a first suspension member and a second suspension member, each of the first and second suspension members having electrically conductive cords;
a monitoring arrangement for monitoring an integrity status of the suspension member arrangement, wherein the monitoring arrangement includes an alternating voltage generator arrangement, a plurality of input connectors and output connectors, and a voltage analyzer arrangement;
wherein the alternating voltage generator arrangement generates first and second alternating voltages being phase shifted by 180° with respect to each other;
wherein each of the input connectors and the output connectors establishes an electrical connection to the cords in an associated one of the first and second suspension members;
wherein the voltage analyzer arrangement analyzes a neutral point voltage resulting from applying the first alternating voltage to the cords of one of the first and second suspension members, applying the second alternating voltage to another one of the first and second suspension members and, after transmission of the first and second alternating voltages through the cords, superimposing the transmitted first and second alternating voltages;
wherein a first of the input connectors and a second of the input connectors are electrically connected to the alternating voltage generator arrangement and a first of the output connectors and a second of the output connectors are electrically connected to the voltage analyzer arrangement; and wherein the first input connector and the first output connector establish a first circuitry in which the first alternating voltage is applied via the first input connector to a first end region of at least some of the cords in the first suspension member and, after transmission of the first alternating voltage through all of the cords of the first suspension member, the first alternating voltage is further transmitted via the first output connector to the voltage analyzer arrangement, and wherein the second input connector and second output connector establish a second circuitry in which the second alternating voltage is applied via the second input connector to a first end region of at least some of the cords in the second suspension member and, after transmission of the second alternating voltage through all of the cords of the second suspension member, the second alternating voltage is further transmitted via the second output connector to the voltage analyzer arrangement.

2. The elevator according to claim 1 wherein the first input connector is connected to the first suspension member at the first end region and the first output connector is connected to the first suspension member at an opposing second end region of the cords thereby interconnecting all of the cords in the first suspension member in parallel, and wherein the second input connector is connected to the second suspension member at the first end region and the second output connector is connected to the second suspension member at an opposing second end region of the cords thereby interconnecting all of the cords in the second suspension member in parallel.

3. The elevator according to claim 1 further comprising:
wherein the first input connector is connected to a first group of the cords in the first suspension member at the first end region, the first output connector is connected to a second group of the cords in the first suspension member at the first end region, and a first interconnecting connector is connected to the first and second groups of the cords in the first suspension member at an opposing second end region of the cords;
wherein the first suspension member has all of the cords in the first group connected in parallel between the first input connector and the first interconnecting connector, all of the cords in the second group connected in parallel between the first output connector and the first interconnecting connector, and the first group connected in series with the second group between the first input connector and the first output connector;
wherein the second input connector is connected to a first group of the cords in the second suspension member at the first end region, the second output connector is connected to a second group of the cords in the second suspension member at the first end region, and a second interconnecting connector is connected to the first and second groups of the cords in the second suspension member at an opposing second end region of the cords; and
wherein the second suspension member has all of the cords in the first group connected in parallel between the second input connector and the second interconnecting connector, all of the cords in the second group connected in parallel between the second output connector and the second interconnecting connector, and the first group connected in series with the second group between the second input connector and the second output connector.

4. The elevator according to claim 1 wherein the suspension member arrangement includes more than two of the suspension members, the elevator further comprising a multiplexer arrangement adapted to selectively electrically connect the alternating voltage generator arrangement to only two of the suspension members simultaneously.

5. The elevator according to claim 4 wherein the multiplexer arrangement is adapted to selectively electrically connect alternating voltage generator arrangement to the voltage analyzer arrangement through only two of the suspension members simultaneously.

6. The elevator according to claim 4 wherein the first suspension member is fixedly electrically connected to the alternating voltage generator arrangement and to the voltage analyzer arrangement and wherein the multiplexer arrangement is adapted to selectively electrically connect others of the suspension members to the alternating voltage generator arrangement.

7. The elevator according to claim 6 wherein each of the suspension members is fixedly electrically connected to the voltage analyzer arrangement.

8. The elevator according to claim 7 wherein the second output connector and an output connector of each of the suspension members other than the first suspension member are electrically interconnected.

9. A monitoring arrangement for monitoring an integrity status of a suspension member arrangement of an elevator, the suspension member arrangement including at least a first suspension member and a second suspension member, each of the suspension members having electrically conductive cords, the monitoring arrangement comprising:
an alternating voltage generator arrangement generating a first alternating voltage and a second alternating voltage being phase shifted by 180° with respect to each other;
a plurality of input connectors and output connectors, each of the connectors establishing an electrical connection to the cords in an associated one of the suspension members;
a voltage analyzer arrangement analyzing a neutral point voltage resulting from applying the first alternating voltage to the cords of one of the first and second suspension members and applying the second alternating voltage to another of the first and second suspension members, transmission of the first and second alternating voltages through the cords and superimposing the transmitted first and second alternating voltages;
wherein a first of the input connectors and a second of the input connectors are electrically connected to the alternating voltage generator arrangement and a first of the output connectors and a second of the output connectors are electrically connected to the voltage analyzer arrangement;
wherein the first input connector and the first output connector establish a first circuitry in which the first alternating voltage is applied via the first input connector to a first end region of at least some of the cords in the first suspension member and, after transmission of the first alternating voltage through all of the cords of the first suspension member, the first alternating voltage is transmitted via the first output connector to the voltage analyzer arrangement; and
wherein the second input connector and the second output connector establish a second circuitry in which the second alternating voltage is applied via the second input connector to a first end region of at least some of the cords in the second suspension member and, after transmission of the second alternating voltage through all of the cords of the second suspension member, the second alternating voltage is transmitted via the second output connector to the voltage analyzer arrangement.

10. A method for monitoring an integrity status of a suspension member arrangement of an elevator, the suspension member arrangement including at least a first suspension member and a second suspension member, each of the suspension members having electrically conductive cords, the method comprising the steps of:

establishing an electrical connection to the cords in each of the first and second suspension members with a plurality of input connectors and output connectors;

generating first and second alternating voltages being phase shifted by 180° with respect to each other from an alternating voltage generator arrangement;

using a voltage analyzer arrangement to analyze a neutral point voltage resulting from applying one of the first and second alternating voltages to the cords of the first suspension member and applying another of the first and second alternating voltages to the cords of the second suspension member, and superimposing the first and second alternating voltages transmitted through the cords;

wherein a first input connector and a second input connector of the input connectors are electrically connected to the alternating voltage generator arrangement and a first output connector and a second output connector of the output connectors are electrically connected to the voltage analyzer arrangement;

wherein the first input connector and the first output connector establish a first circuitry to which the first alternating voltage is applied via the first input connector to a first end of at least some of the cords in the first suspension member, the first alternating voltage being transmitted through all of the cords of the first suspension member and the first output connector to the voltage analyzer arrangement; and wherein the second input connector and the second output connector establish a second circuitry to which the second alternating voltage is applied via the second input connector to a first end of at least some of the cords in the second suspension member, the second alternating voltage being transmitted through all of the cords of the second suspension member and the second output connector to the voltage analyzer arrangement.

* * * * *